United States Patent
Lovelace et al.

(10) Patent No.: US 6,819,196 B2
(45) Date of Patent: Nov. 16, 2004

(54) CRYSTAL OSCILLATOR WITH CONTROL FEEDBACK TO MAINTAIN OSCILLATION

(75) Inventors: David K. Lovelace, Chandler, AZ (US); Klaas Wortel, Phoenix, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 0 days.

(21) Appl. No.: 10/366,177

(22) Filed: Feb. 13, 2003

(65) Prior Publication Data

US 2004/0160285 A1 Aug. 19, 2004

(51) Int. Cl.[7] .................................................. H03B 5/32
(52) U.S. Cl. ...................... 331/183; 331/158; 331/16
(58) Field of Search ................................ 331/183, 158, 331/16, 116 R, 175

(56) References Cited

U.S. PATENT DOCUMENTS

| | | | | |
|---|---|---|---|---|
| 4,810,922 A | * | 3/1989 | Hirsch | 310/316.01 |
| 5,047,734 A | * | 9/1991 | Newell et al. | 331/46 |
| 6,137,375 A | * | 10/2000 | Li | 331/175 |
| 6,563,391 B1 | | 5/2003 | Mar | 331/116 R |
| 6,577,201 B2 | | 6/2003 | Ho et al. | 331/16 |
| 6,580,332 B2 | | 6/2003 | Sutliff et al. | 331/158 |

* cited by examiner

Primary Examiner—Benny Lee
Assistant Examiner—Joseph Chang
(74) Attorney, Agent, or Firm—Meyertons Hood Kivlin Kowert & Goetzel, P.C.; Jeffrey C. Hood; Erik A. Heter

(57) ABSTRACT

An oscillator circuit. In one embodiment, the oscillator includes a gain circuit, an envelope detector, and an amplitude comparison circuit. The trans-conductance circuit is configured to amplify a periodic signal produced by a crystal. Amplitude peaks of the periodic signal may be detected in the envelope detector, which may determine an average amplitude value based on the detected peaks. The average amplitude value may be compared to a DC voltage value in an amplitude comparison circuit. The DC voltage value may include both a DC average of the periodic signal as well as a predetermined DC offset value. The gain circuit may adjust the level of amplification of the periodic signal based on a feedback signal in order to ensure that the oscillator produces a periodic output signal at a desired level so as to insure oscillation and the minimum use of current to achieve oscillations.

18 Claims, 2 Drawing Sheets

CRYSTAL OSCILLATOR WITH CONTROL FEEDBACK TO MAINTAIN OSCILLATION

FIELD OF THE INVENTION

This invention relates to electronic circuits, and more particularly, to oscillator circuits.

DESCRIPTION OF THE RELATED ART

Oscillator circuits are very important in modern electronics. Oscillators are used to generate periodic waveforms and may have a wide variety of applications. These applications may include the generation of clock signals for synchronous electronic systems (e.g., computer systems), generation of a mixing signal for conversion of a signal to another frequency band in a radio receiver, or generation of a carrier signal upon which information may be transmitted. Countless other examples exist as well.

Oscillator circuits are subject to various problems. In some oscillator circuits, it is difficult to sustain oscillation over a wide variation in temperature, devices process variation and frequency. Another problem with oscillator circuits is that it may sometimes be difficult to obtain a stable state upon initialization.

Various types of oscillator circuits have been designed to cope with the problems discussed above. However, often times these circuits require excess current consumption to insure operation over all required conditions.

SUMMARY OF THE INVENTION

An oscillator circuit is disclosed. In one embodiment, the oscillator includes a trans-conductance circuit, an envelope detector, and an amplitude comparison circuit.

The trans-conductance circuit (or more generally, a gain circuit) is configured to amplify a periodic signal produced by a crystal. Amplitude peaks of the periodic signal may be detected in the envelope detector, which may determine an average amplitude value based on the detected peaks. The average amplitude value may be compared to a DC voltage value in the amplitude comparison circuit. The DC voltage value may include both a DC average of the periodic signal as well as a predetermined DC offset value. The amplitude comparison circuit may generate a feedback signal responsive to the comparison. The trans-conductance circuit may adjust the level of amplification of the periodic signal based on the feedback signal in order to ensure that the oscillator produces a periodic output signal at a desired level. The periodic signal may be provided as an output through an output stage.

A method for producing a periodic output signal includes first producing a periodic signal with a crystal. The periodic signal may be amplified by a trans-conductance circuit, and an average amplitude value of the periodic signal may be determined. The average amplitude value of the periodic circuit may be compared to a DC voltage value, wherein the DC voltage value is the sum of a DC average value of the periodic signal and a predetermined DC offset voltage value. Responsive to the comparison, a feedback signal may be generated and provided through a feedback loop to the trans-conductance circuit. The trans-conductance circuit may adjust the level of amplification provided to the periodic signal responsive to the feedback signal. The periodic signal may be received by an output stage which buffers the signal and provides a periodic output signal.

BRIEF DESCRIPTION OF THE DRAWINGS

Other aspects of the invention will become apparent upon reading the following detailed description and upon reference to the accompanying drawings in which.

Figure 1:
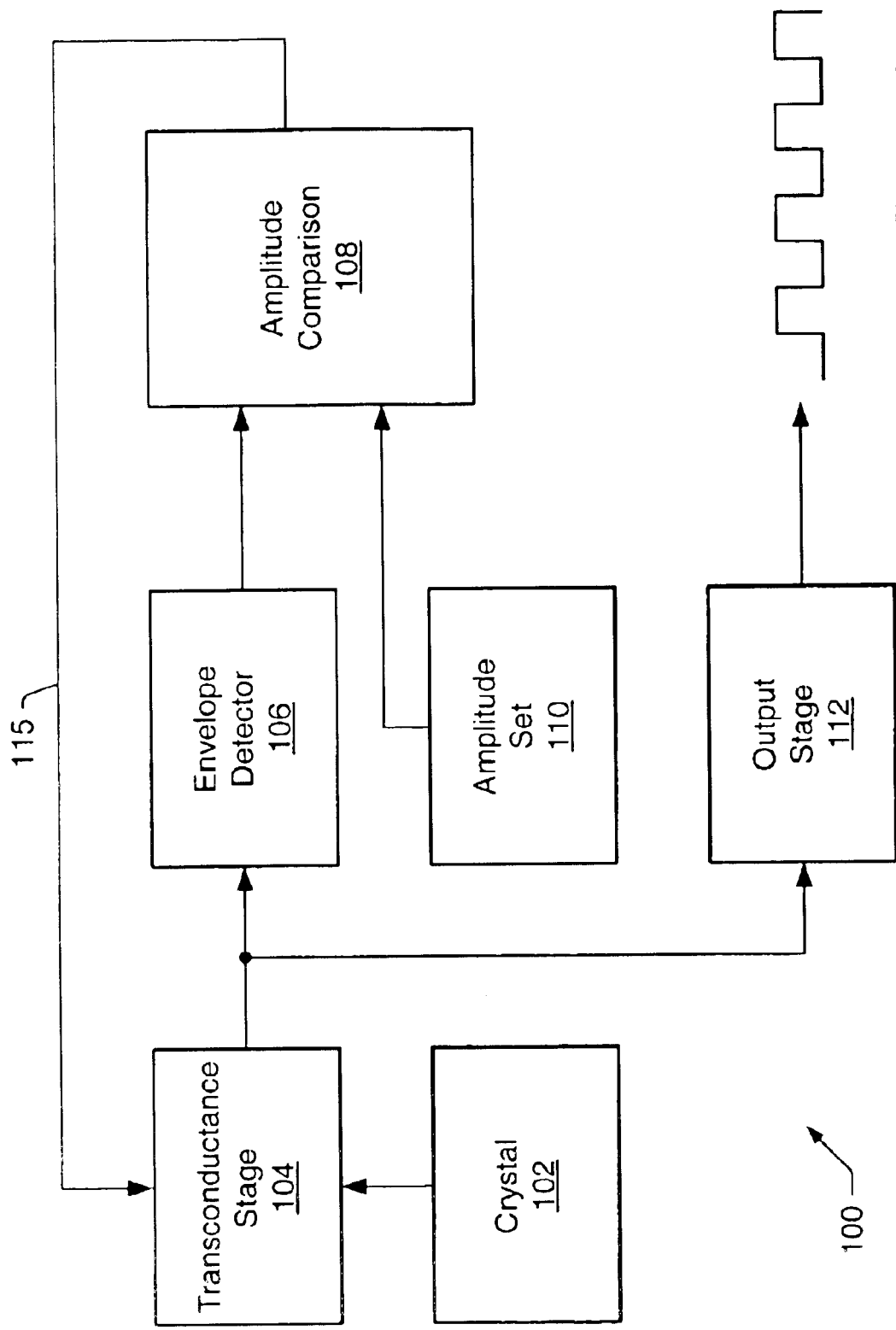
FIG. 1 is a block diagram of one embodiment of an oscillator circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

FIG. 1 is a block diagram of one embodiment of an oscillator circuit. In the embodiment shown, oscillator circuit 100 includes crystal 102, which is configured to generate a periodic signal. The periodic signal may be conveyed to trans-conductance (i.e. gain) stage 104, which may in turn amplify the periodic signal. The output of trans-conductance stage 104 may be received by output stage 112, which may provide amplification and buffering of the periodic signal in order to provide a stable periodic output signal. In one embodiment, output stage 112 is configured to provide output signals at voltage and/or current levels that are compatible with CMOS (complementary metal oxide semiconductor) devices.

Envelope detector 106 may also receive the periodic signal that is conveyed from trans-conductance stage 104. The functions performed by envelope detector 106 may include amplitude peak detection and determination of an average amplitude value of the periodic signal.

Amplitude set circuit 110 may be used in order to set an approximate amplitude at which the periodic signal is to be provided for output from oscillator circuit 100. Among the functions performed by amplitude set circuit may be the generation of a DC offset voltage. Although not explicitly shown here, amplitude set circuit may also be coupled to the output of trans-conductance stage 104 and may be configured to determine a DC average value of the periodic signal.

Amplitude comparison circuit 108 is configured to receive signals from both envelope detector 106 and amplitude set circuit 110, and perform a comparison operation. Specifically, amplitude comparison circuit 108 may compare the amplitude level of the periodic signal output by trans-conductance stage 104 with the desired amplitude as defined by amplitude set circuit 110. In response to the comparison, amplitude comparison circuit 108 may generate a feedback signal which may be provided to trans-conductance stage 104 via feedback path 115. Responsive to receiving the feedback signal, trans-conductance stage 104 may adjust the level of amplification to the periodic signal received from crystal 102.

In some embodiments, oscillator circuit 100 may include signal shaping circuits in order to provide a periodic output signal of a specific shape. The embodiment shown here is configured to output a square wave. However, other embodiments are possible and contemplated wherein the output signal may be a sine wave, a saw tooth wave, or other signal shape.

Figure 2:
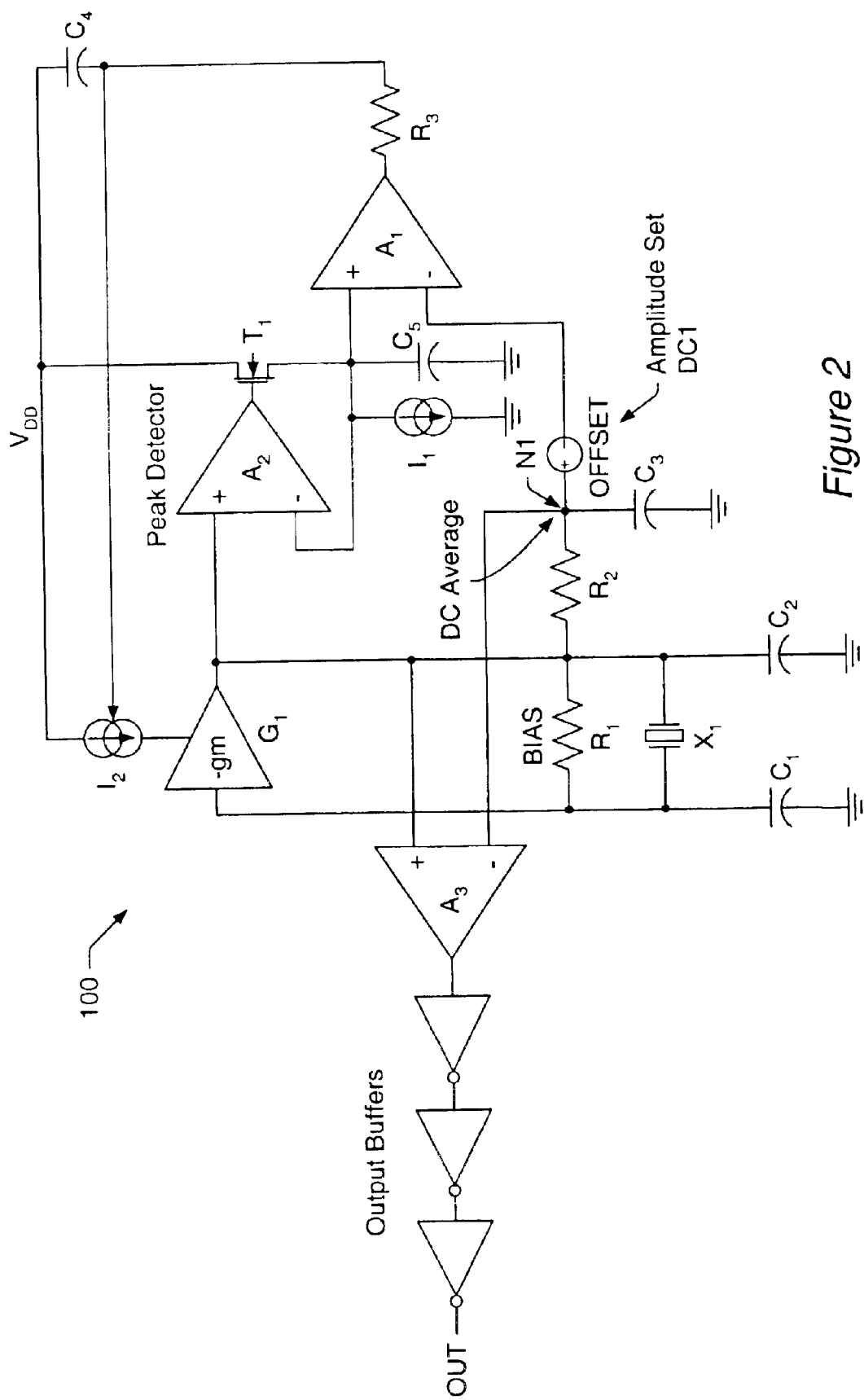
FIG. 2 is a schematic diagram of one embodiment of an oscillator circuit.

FIG. 2 is a schematic diagram of one embodiment of an oscillator circuit. In the embodiment shown, crystal $X_1$ is configured to generate a periodic signal. The periodic signal may be received by a trans-conductance circuit $G_1$, which may amplify the periodic signal. In one embodiment, trans-conductance circuit $G_1$ may be implemented using a single FET (field effect transistor), with the periodic signal being conveyed between the source and the drain terminals, with the amount of amplification provided controlled by a signal on its gate terminal or by a constant current forced through the source-drain of the device by means of a current source such as $I_2$. Other more complex embodiments are possible and contemplated.

Crystal $X_1$, and trans-conductance circuit $G_1$ may be analogous to crystal 102 and trans-conductance circuit $G_1$ may be analogous to trans-conductance stage 104 of FIG. 1, respectively.

The amplified periodic signal output by trans-conductance circuit $G_1$ may be received on one of the inputs of amplifier $A_2$. Amplifier $A_2$, transistor $T_1$, capacitor $C_5$, and current source $I_1$ may form a circuit with a function like that of envelope detector 106 of FIG. 1. In particular, amplifier $A_2$ and transistor $T_1$ may perform a peak detection function. The peak detection function may detect an amplitude peak of the periodic signal. Capacitor $C_5$ and current source $I_1$ may perform an averaging function, as well as providing a feedback signal to the inverted input of amplifier $A_2$. The output signal from trans-conductance circuit $G_1$ may be provided as one input to amplifier $A_2$, with the signal on the previously mentioned feedback path being provided as the other. When a sufficient output voltage level is provided by amplifier $A_2$, transistor $T_1$ may be turned on, allowing current to flow between VDD and the junction of $I_1$ and $C_5$. This may cause $C_5$ to charge. When the output voltage of $A_2$ falls below a certain threshold, transistor $T_1$ may turn off and capacitor $C_5$ may discharge through current source $I_1$. The action of charging and discharging capacitor $C_5$ may provide a signal to the non-inverting input of amplifier $A_1$ that is approximately an average amplitude value of the periodic signal.

It should be noted that a resistor may be used in place of the current source to provide a discharge path in some embodiments. The use of the controlled current source instead of a resistor may consume less space.

The combination of resistor $R_2$, capacitor $C_3$, and voltage source $DC_1$ may form an amplitude setting circuit such as the amplitude set circuit 110 shown in FIG. 1. In particular, the combination of resistor $R_2$ and capacitor $C_3$ may form a low pass filter. The low pass filter may have a single pole at a very low frequency, and thus may be able to extract an average DC voltage (referred to hereafter as 'DC average') from the periodic signal output by trans-conductance circuit $G_1$. This DC average may appear that the junction of resistor $R_2$ and capacitor $C_3$. The DC average may be added to a DC voltage produced by voltage source $DC_1$ to provide a voltage signal for setting the desired amplitude of the periodic signal that is to be output by oscillator circuit 100.

Amplifier $A_1$ may perform an amplitude comparison function for crystal oscillator 100. The DC voltage provided by the amplitude set circuitry and a signal (representing the average value of the periodic signal) provided by the envelope detection circuitry are the inputs to amplifier $A_1$ in this particular embodiment. Amplifier $A_1$ may generate a feedback signal responsive to the respective voltage levels of the signals received at its inputs.

Oscillator circuit 100 includes a feedback path between the output of amplifier A1 and a control terminal of trans-conductance circuit $G_1$. The feedback path includes resistor $R_3$ and current source $I_2$. Resistor $R_3$ in conjunction with capacitor $C_4$ forms a low-pass filter, which may be useful in filtering out rapid fluctuations in the feedback signal and may thereby enhance stability of oscillator circuit 100.

The amount of current provided by current source $I_2$ may vary responsive to variations in the level of the feedback signal. The current provided by current source $I_2$ may be applied to a control terminal of trans-conductance circuit $G_1$. As noted above, one embodiment of oscillator circuit 100 may implement trans-conductance circuit $G_1$ using a single FET, with the gate terminal as the control terminal. Thus, as the amount of voltage applied to the gate varies, the amount of current (and thus the amplitude of the periodic signal) that may flow between the source and the drain of the transistor will match that of the current source $I_2$. Other embodiments are possible and contemplated as well. For example, embodiments using a single bi-polar transistor are contemplated, as well as embodiments using more complex circuitry than that which is discussed here.

The output node of trans-conductance circuit $G_1$ may be coupled to a non-inverting input of amplifier $A_3$, with the DC average node coupled to the inverting input. Amplifier $A_3$ and the inverters shown in this embodiment may form an output stage that is analogous to output stage 112 of FIG. 1. Other embodiments are possible and contemplated, including embodiments with non-inverting buffers or with no buffers/inverters. In this particular embodiment, the output stage is configured to provide a periodic output signal at a voltage/current level that is suitable for use with CMOS devices.

It should be noted that the presence of voltage source $DC_1$ and the initial condition on node $N_1$ (see change to FIG. 2) may ensure that oscillator circuit 100 may produce a periodic output signal almost instantaneously upon startup, as a voltage input to amplifier $A_1$ may produce a feedback signal that causes trans-conductance circuit $G_1$ to amplify the periodic signal from crystal $X_1$ as soon as it begins oscillating. The initial condition of node $N_1$ can be forced to a voltage which will cause the trans-conductance stage to start operating with the highest gain to insure rapid startup. The presence of output circuitry as shown herein may ensure that the output periodic signal is produced at the necessary levels (e.g., CMOS) for the application in which it is being used, even while the feedback loop is working to correct the bias current to trans-conductance circuit $G_1$. Furthermore, oscillator circuit 100 may be designed to operate with a minimal amount of current drain over a wide range of temperatures, crystal characteristics, frequency, and supply voltage.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An oscillator circuit comprising:

a gain circuit, wherein the gain circuit is configured to amplify and output a periodic signal at a frequency determined by a crystal;

an envelope detector coupled to an output of the circuit, wherein the envelope detector is configured to determine an average amplitude value of the periodic signal; and an amplitude comparison circuit, wherein the amplitude comparison circuit is configured to compare the average amplitude value of the periodic signal to a DC (direct current) voltage value and further configured to provide feedback to the gain circuit, wherein the gain circuit is configured to adjust the average amplitude of the periodic signal based on a value of the feedback signal.

2. The oscillator circuit as recited in claim 1, wherein the oscillator circuit includes an amplitude set circuit coupled to provide a DC value to the amplitude comparison circuit.

3. The oscillator circuit as recited in claim 2, wherein the amplitude set circuit is configured to determine an average DC value of the periodic signal and a DC offset circuit configured to produce a DC offset.

4. The oscillator circuit as recited in claim 3, wherein the amplitude set circuit is configured to provide a DC input to the amplitude comparison circuit, wherein the DC input is the sum of the average DC value of the periodic signal and the DC offset.

5. The oscillator circuit as recited in claim 1, wherein the amplitude comparison circuit is coupled to a source circuit, and wherein an output signal provided by the source circuit varies with a level of a feedback signal output by the amplitude comparison circuit.

6. The oscillator circuit as recited in claim 5, wherein the source circuit is coupled to a control terminal of the gain circuit, wherein the gain circuit is configured to vary a level of the periodic signal responsive to the source circuit varying a level of the output signal.

7. The oscillator circuit as recited in claim 6, wherein the source circuit is a current source, and wherein the output signal is a current signal.

8. The oscillator circuit as recited in claim 6, wherein the source circuit is a voltage source, and wherein the output signal is a voltage signal.

9. The oscillator circuit as recited in claim 1, wherein the envelope detector includes a peak detection circuit configured to detect an amplitude peak of the periodic signal.

10. The oscillator circuit as recited in claim 1, wherein the oscillator includes an output stage.

11. A method of producing a periodic output signal, the method comprising:

producing a periodic signal with a crystal;

amplifying the periodic signal with a gain circuit;

determining an average amplitude value of the periodic signal;

comparing the average amplitude value to a DC voltage value relative to a DC voltage of the periodic signal;

generating a feedback signal based on said comparing;

adjusting the average amplitude of the periodic signal by varying an amount of amplification provided by the gain circuit; and buffering the periodic signal in an output stage in order to produce the periodic output signal suitable for use in circuits outside of the oscillator.

12. The method as recited in claim 11, wherein the DC voltage value is provided by an amplitude set circuit.

13. The method as recited in claim 12, wherein the amplitude set circuit is configured to determine the DC average of the periodic signal.

14. The method as recited in claim 13, wherein the DC voltage value is a sum of a DC offset voltage and a DC average of the periodic signal.

15. The method as recited in claim 13, wherein said determining is performed by an envelope detector and said comparing is performed by an amplitude compare circuit, wherein the amplitude compare circuit is coupled to receive a signal indicative of the average value of the periodic signal from the envelope detector and the DC voltage value from the amplitude set circuit, and wherein the amplitude compare circuit is configured to generate the feedback signal responsive to said comparing.

16. The method as recited in claim 15, wherein the amplitude compare circuit is coupled to the gain circuit by a feedback path, the feedback path including a current or voltage source, wherein an amount of current or voltage provided by the current or voltage source is determined by a value of the feedback signal provided by the amplitude compare circuit.

17. The method as recited in claim 16, wherein an amount of amplification provided by the gain circuit is varied based on an amount of current supplied by the current or voltage source.

18. The method as recited in claim 15, wherein the envelope detector includes a peak detection circuit configured to detect an amplitude peak of the period signal.

* * * * *